US006397375B1

(12) United States Patent
Block et al.

(10) Patent No.: US 6,397,375 B1
(45) Date of Patent: May 28, 2002

(54) METHOD FOR MANAGING METAL RESOURCES FOR OVER-THE-BLOCK ROUTING IN INTEGRATED CIRCUITS

(75) Inventors: Adam Stuart Block, Fort Collins; Jeffrey P Witte; Don D Josephson, both of Ft Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/507,240

(22) Filed: Feb. 18, 2000

(51) Int. Cl.[7] .......................... G06F 17/50; H01L 25/03; H03K 19/00
(52) U.S. Cl. .......................................... 716/14; 326/101
(58) Field of Search .......................... 716/1–21; 326/41, 326/47, 101–103

(56) References Cited

U.S. PATENT DOCUMENTS

| | | | | |
|---|---|---|---|---|
| 5,841,664 A | * | 11/1998 | Cai et al. ....................... | 716/14 |
| 5,859,999 A | | 1/1999 | Morris et al. ................ | 712/224 |
| 5,860,017 A | | 1/1999 | Sharangpani et al. ......... | 712/23 |
| 5,984,510 A | * | 11/1999 | Guruswamy et al. .......... | 716/12 |
| 6,014,507 A | * | 1/2000 | Fujii ............................ | 716/12 |
| 6,230,304 B1 | * | 5/2001 | Groeneveld et al. ............ | 716/7 |

OTHER PUBLICATIONS

Guan et al. ("An area minimizing layout generator for random logic blocks", Proceedings of the IEEE 1995 Custom Integrated Circuits Conference, May 1, 1995, pp. 457–460).*

Taliercio et al. ("A procedural datapath compiler for VLSI full custom applications", Proceedings of the IEEE Custom Integrated Circuits Conference, May 12, 1991, pp. 22.5/1–22.5/4).*

Ammar et al. ("A high density datapath compiler mixing random logic with optimized blocks", Proceedings of 4th European Conference on Design Automation, 1993, with the European Even in ASIC Design, Feb. 22, 1993, pp. 194–198).*

Panyam et al. ("An optimal algorithm for maximum two planar subset problem", Proceedings of Fourth Great Lakes Symposium on VLSI, Design Automation of High Performance VLSI Systems, Mar. 4, 1994, pp. 80–85).*

Danda et al. ("Optimal algorithms for planar over–the–cell routing problems", IEEE Transactions on Computer–Aided Design of Integrated Circuits and Systems, Nov. 1996, vol. 15, No. 11, pp. 1365–1378).*

Cong et al. ("General models and algorithms for over–the–cell routing in standard cell design", Proceedings of 27th ACM/IEEE Design Automation Conference, Jun. 24, 1990, pp. 709–715).*

Tsuchiya et al. ("A three–layer over–the–cell multi–channel routing method for a new cell model", Proceedings of the ASP–DAC '95/CHDL '95/VLSI '95 Design Automation Conference, Aug. 29, 1995, pp. 195–202).*

Danda et al. ("Optimal algorithms for planar over–the–cell routing in the presence of obstacles", Proceedings of the 8th International Conference on VLSI Design, Jan. 4, 1995, pp. 3–7).*

Wolfe, Alexander, "Patents Shed Light on Merced," Electronic Engineering Times, Feb. 15, 1999, pp. 43–44.

Interactive Repeater Insertion Simulator (IRIS) System And Method, Application No. 09/329556, Filed Jun. 10, 1999, Inventor: John D. Wanek.

* cited by examiner

Primary Examiner—Matthew Smith
Assistant Examiner—Phallaka Kik

(57) ABSTRACT

A method and system for managing metal resources in the physical design of integrated circuits is presented. Percent metal usage is allocated for intra-block routing use by each functional block. Power and clock grids are established. Block designers coordinate the locations of signal ports of the blocks so as to avoid blocking any inter-block signals, areas of metal are then reserved for ports and intra-block signals. The inter-block signals are then pre-routed, avoiding the power grid, clock grid, and reserved intra-block routing metal. If any problem nets emerge from the pre-routing, better port locations and sub-block placement within the respective blocks are determined and the process is repeated.

8 Claims, 7 Drawing Sheets

METHOD FOR MANAGING METAL RESOURCES FOR OVER-THE-BLOCK ROUTING IN INTEGRATED CIRCUITS

FIELD OF THE INVENTION

The present invention pertains generally to interconnect routing in integrated circuit design, and more particularly to a method for managing the metal resources used in over-the-block routing in integrated circuits.

BACKGROUND OF THE INVENTION

Integrated circuits comprise a plurality of electronic components that function together to implement a higher-level function. ICs are formed by implanting a pattern of transistors into a silicon wafer which are then connected to each other by layering multiple layers of metal materials, interleaved between dielectric material, over the transistors. The fabrication process entails the development of a schematic diagram that defines the circuits to be implemented. A chip layout is generated from the schematic. The chip layout, also referred to as the artwork, comprises a set of planar geometric shapes over several layers that implement the circuitry defined by the schematic. A mask is then generated for each layer based on the chip layout. Each metal is then successively manufactured over the silicon wafer according to the layer's associated mask using a photolithographical technique.

The process of converting the specifications of an electrical circuit schematic into the layout is called the physical design process. CAD tools are extensively used during all stages of the physical design process. The physical design process is accomplished in several stages including partitioning, floorplanning, and routing.

During the partitioning stage, the overall integrated circuit is partitioned into a set of functional subcircuits called blocks. The block partitioning process considers many factors including the number and size of the blocks, and number of interconnections between the blocks. The output of partitioning is a set of blocks along with a set of interconnections required between blocks, referred to herein as a netlist.

During the floorplanning stage, a floorplan is developed defining the placement and rectangular shape of each block. The goal of the floorplanning stage is to select the optimal layout for each block, as well as for the entire chip.

Once an acceptable floorplan is developed, the interconnections between the blocks (as defined by the netlist) are routed. The space not occupied by the blocks is partitioned into rectangular regions referred to as channels. Interconnects are preferably routed within the designated channels, but may also be routed through defined feedthroughs through the blocks, or in defined over-the-block routing space.

The goal of a router is to complete all circuit connections resulting in minimal interconnect signal delay. Where possible, the router will generally attempt to route individual interconnects on a single layer; however, if this is not achievable given the topology of the netlist, an interconnect may be routed over two or even more layers. Often, interconnect routes resulting from the autorouting will be too long to meet signal delay specifications. The delay results from the inherent RC characteristics of the interconnect line.

Over the past decades, integrated circuits (ICs) of increasingly higher density have been developed to meet industry demands of higher performance and smaller packaging. The very high densities of today's integrated circuits means that more metal layers and interconnects per layer are required than ever before. The result is that the routing task has become even more complex.

Generally, the lowest level metal layers are used by local block interconnects, i.e., intra-block signals, and higher-level metal layers are used by inter-block interconnects. Each layer includes a power grid and clock distribution signals. In high density integrated circuits, all of the intra-block routing often cannot be achieved within the lowest level metal layers. Accordingly, metal in the higher layers must often be reserved for intra-block routing.

It is clear from this description that several distinct route types compete for the available metal resources in the different metal layers. In this respect, the power grid, the clock distribution system, the intra-block routing, and the global inter-block routing all compete for metal on some, if not all, of the metal layers. Therefore, unless metal tracks in each of the higher-level metal layers are specifically set aside on each of those layers for each of the respective routing types, the auto-router may not be able to find a complete or satisfactory routing solution.

In the prior art, a number of metal tracks in each layer are pre-allocated for use by each of the different route types. Once a track is pre-allocated for use by a particular route type, its use must remain for that purpose. Block designers must design the blocks to interface with the pre-assigned track assignment, which therefore often limits the different combinations of placement of signal ports and sub-blocks within the block. Accordingly, optimal placement of sub-blocks often cannot be achieved. In addition, since the track assignments are immutable, blocks that require more upper-layer intra-block interconnects often must occupy more chip space just to be able to connect to pre-allocated intra-block tracks on those layers. Similarly, blocks that require less upper-layer intra-block interconnects often do not fully utilized pre-allocated intra-block tracks that pass over them. Accordingly, it is clear that the density of the chip is directly affected by the efficiency of use of the upper-level metal layers.

It is therefore an object of the invention to provide a metal management methodology that makes more efficient use of the available metal in each layer.

SUMMARY OF THE INVENTION

The present invention is a novel method and system for managing metal resources during over-the-block routing of an integrated circuit.

The metal management methodology enables advantages in efficiency over the prior art. The communication between block designers as to the block routing requirements facilitates better placement of sub-blocks and signal ports. This results in more efficient use of over-the-block routing metal, as well as facilitates the ability to create higher density blocks. In addition, the allowance of multi-use tracks in over-the-block routing results in less unused metal and therefore also allows higher density blocks.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method and system for managing metal resources during over-the-block routing of an integrated circuit is described in detail hereinafter.

Figure 1:
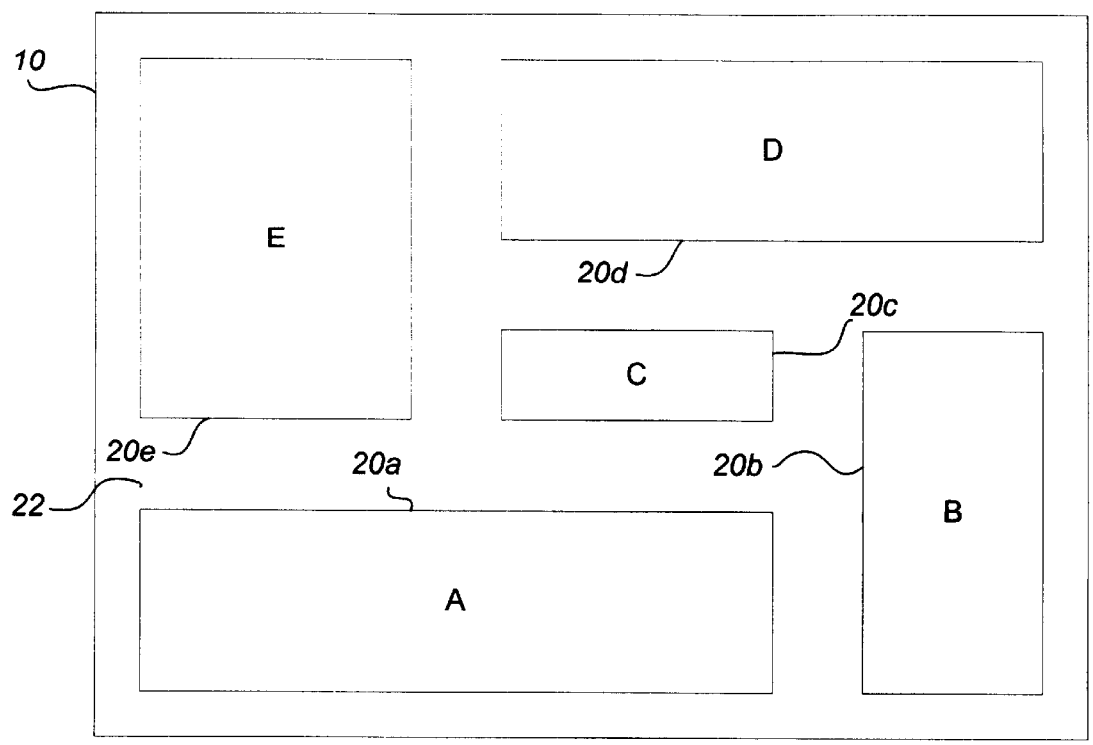
FIG. 1 is a top view layout diagram of an integrated circuit.

FIG. 1 is a top view layout diagram of an integrated circuit (IC) 10. IC 10 includes functional blocks A, B, C, D, and E, referenced at 20a–20e. Channels 22 occupy the area between blocks 20a–20e. Inter-block communication is preferably achieved via channel-based routing where possible. In high-density circuits, however, over-the-block routing is usually necessary for efficiency purposes, and the higher the density of the circuit, the more metal layers are typically required.

Figure 2:
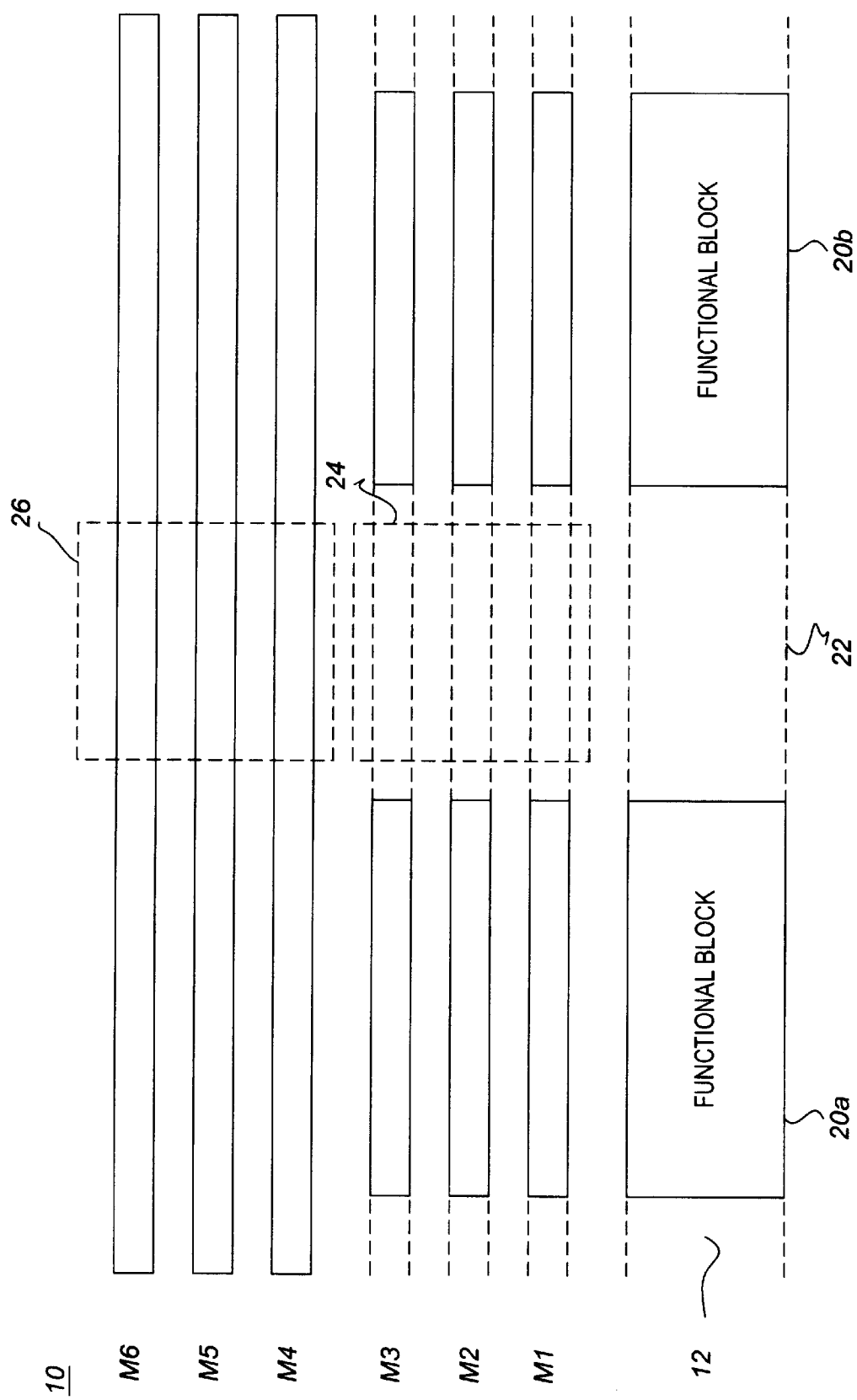
FIG. 2 is a side view of a portion of the integrated circuit of FIG. 1.

FIG. 2 is a side view of a portion of integrated circuit (IC) 10. FIG. 2 illustrates functional blocks 20a and 20b (not to scale) implemented in silicon layer 12. Metal layers M1–M6, sandwiched with intervening dielectric layers (not shown), are layered one on top of the other as illustrated. The metal on each layer M1–M6 is preferably formed in parallel tracks, where the direction of the tracks in adjacent layers is orthogonal.

As described previously, the lowest level metal layers are used by local block interconnects, i.e., intra-block signals, and higher-level metal layers are used by inter-block interconnects. Each layer includes a power grid and clock distribution signals. In the illustrated example, metal layers M1–M3 are used exclusively for intra-block routing, while layers M4–M6 are used mainly for inter-block routing and any intra-block routing that could not be achieved at the lower layers.

Figure 3:
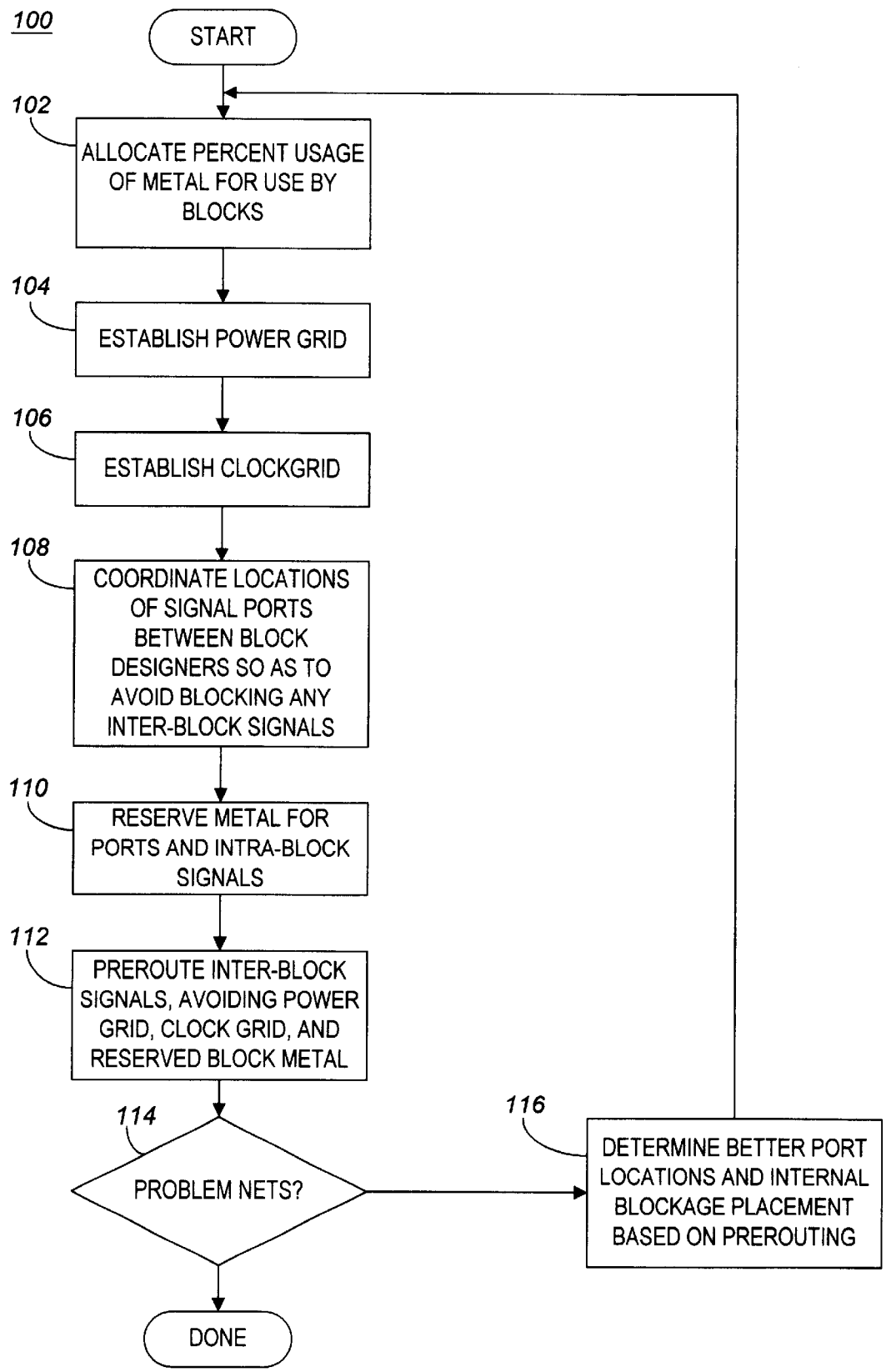
FIG. 3 is a flowchart of the general method of the invention for managing metal resources.

FIG. 3 is a flowchart of the general method 100 of the invention for managing metal resources. At the beginning of the physical design process, a general guideline as to the percentage of M4 metal that will be allocated for use by each block is established 102. Preferably, the percent allocation is determined on an individual basis according to the amount of metal each block is expected to utilize (as estimated by the block designers), and therefore the amount may be different for each block. The flexibility in the allocation of amount of M4 metal allows blocks with large requirements for M4 to receive it, yet does not unnecessarily reserve it for blocks that will not end up utilizing the metal. In the preferred embodiment, the default amount of M4 is 30%, yet some blocks may use up to 100% of the M4 metal over the block.

Figure 5:
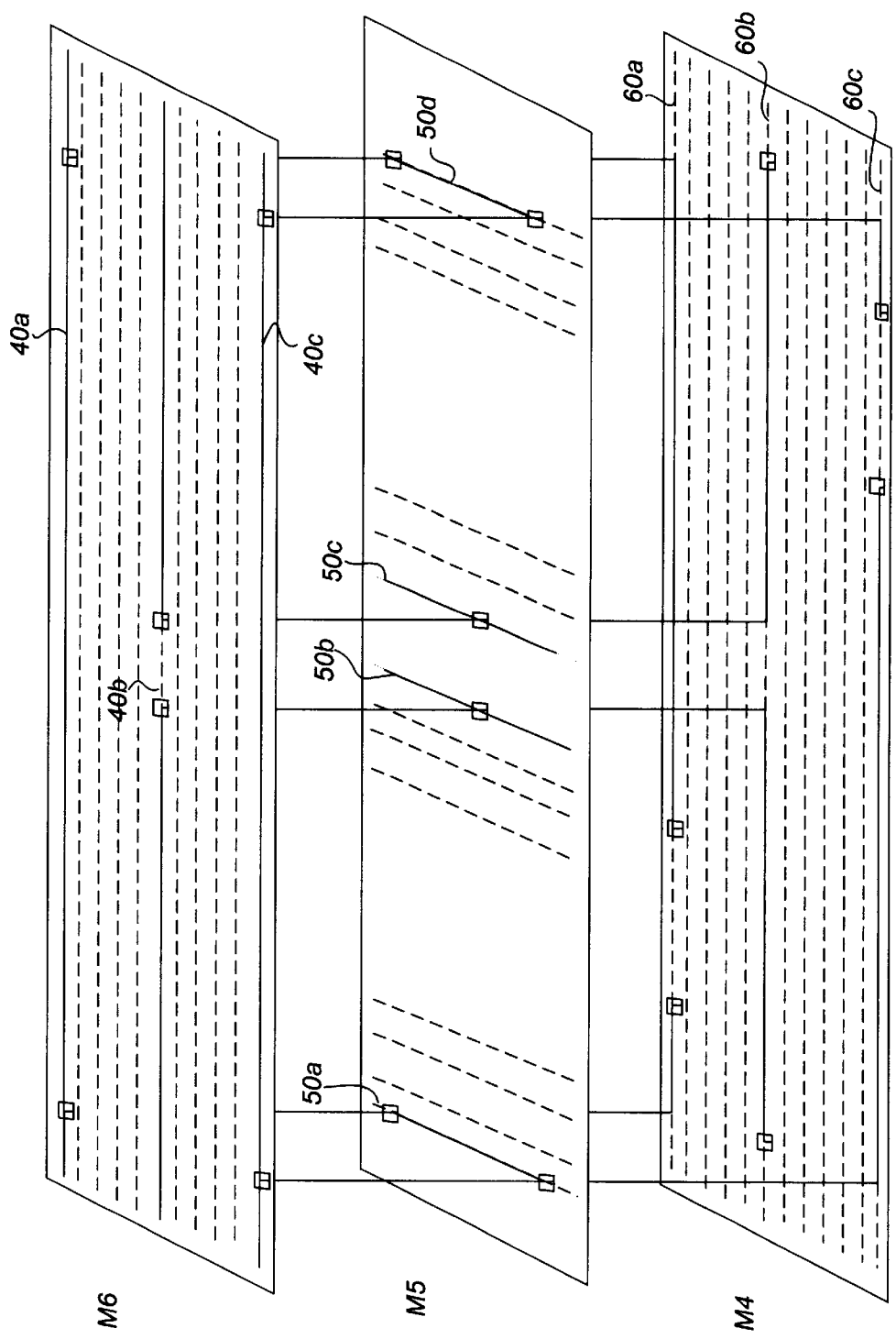
FIG. 5 is a breakout perspective view of a portion of the IC of FIG. 1 illustrating an example implementation of the power grid.

The layout of the power grid is established 104 in the M5 and M6 layers to provide the basic power supply infrastructure from the flip-chip solder bumps (not shown) which connect to the M6 power grid to the block owners M4 grid. FIG. 5 is a perspective view of a portion of IC 10 showing the break-out of layers M4, M5, and M6. Each of metal layers M6, M5, and M4 comprise a plurality of parallel metal tracks. The tracks in each layer are orthogonal to the tracks in each of its adjacent layers. Accordingly, M5 tracks are perpendicular to the M4 and M6 tracks. In the illustrative example, the top layer of the power grid is established on tracks 40a, 40b, and 40c of M6. Each of these tracks 40a, 40b, 40c connect to power grid tracks 50a, 50b, 50c and 50d of layer M5, which in turn connect to power grid tracks 60a, 60b, 60c of layer M4. In actuality, each power grid track 40a–40c, 50a–50d, and 60a–60c comprises at least two individual tracks—one for power and one for ground. They may also comprise additional tracks for different power levels, for example, a 3.3 Volt and a 5 Volt line. For simplicity, the power grid tracks are illustrated as a single track; however, it is to be understood that each power grid track may actually comprise any number of individual tracks for each distinct power/ground level in the power grid.

Figure 6:
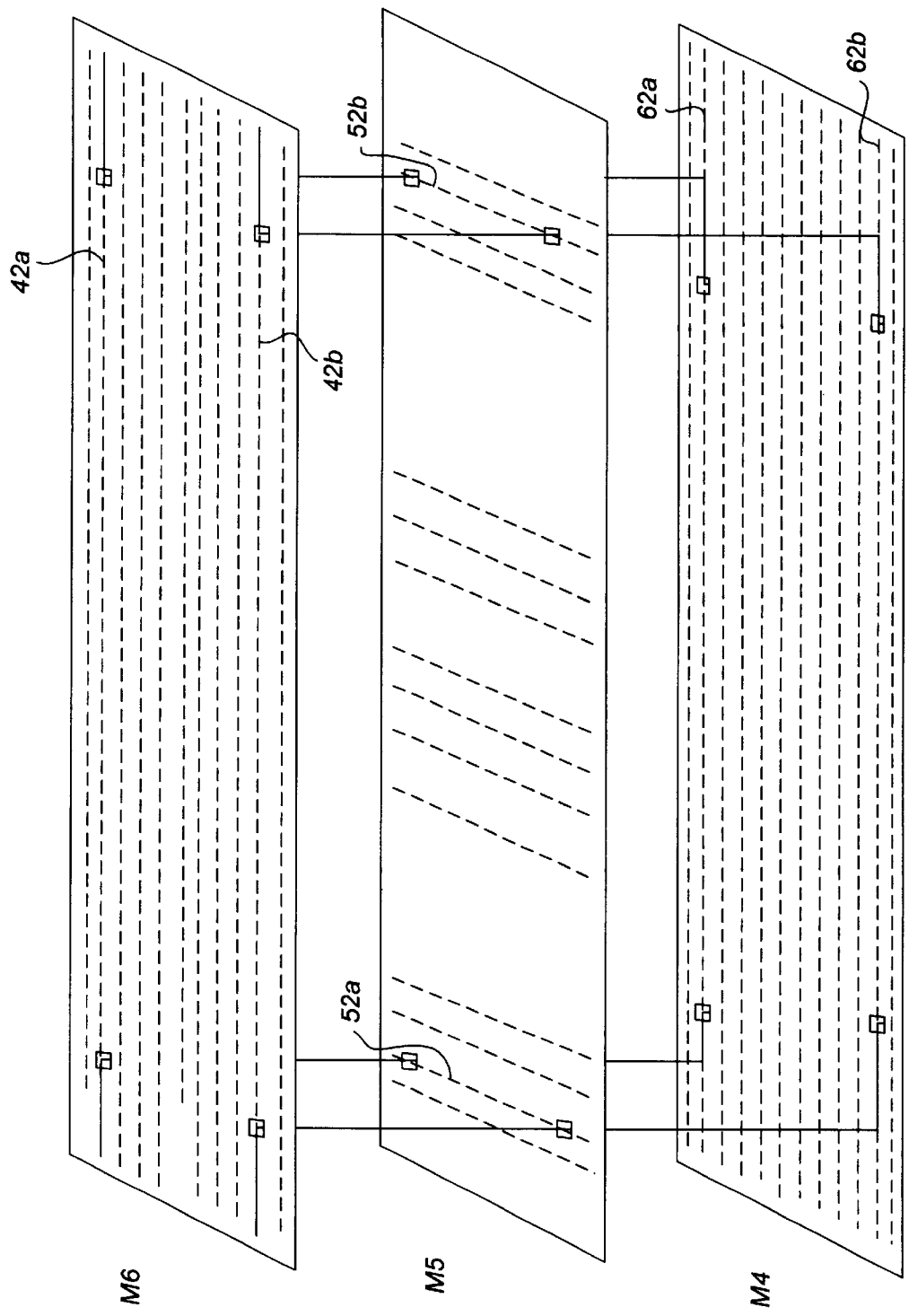
FIG. 6 is a breakout perspective view of a portion of the IC of FIG. 1 illustrating an example implementation of the clock grid.

After establishing the layout of the power grid, the layout of the clock grid is then established 106 (FIG. 3). The establishment of the clock grid prior to assigning metal to use by blocks or for inter-block routing enables more efficient use of metal to lower clock skew and increase performance. FIG. 6 is a perspective view of the same portion of IC 10 of FIG. 5. In the illustrative example, the clock grid is established on tracks 42a and 42b of M6. Clock grid tracks 42a, 42b connect to clock grid tracks 52a, 52b, of layer M5, which in turn connect to clock grid tracks 62a, 62b of layer M4. In actuality, each clock grid track 42a–42b, 52a–52b, and 62a–62b may comprise a plurality of individual tracks, for example, a global clock signal CK, it's complement CK', and a plurality of local clock signals. For simplicity, the clock grid tracks are illustrated as a single track; however, it is to be understood that each clock grid track may actually comprise any number of individual tracks for each distinct clock in the clock grid.

Once the power and clock grids are set up, the block designers then plan 108 the locations of signal ports in coordination with other block designers so as to avoid blocking any inter-block signals. The communication with other block designers allows planning of the respective blocks taking into consideration possible routing conflicts with other blocks. This early planning allows better placement of signal ports in order to avoid inter-block signal routing conflicts due to insufficient routing resources.

Figure 4:
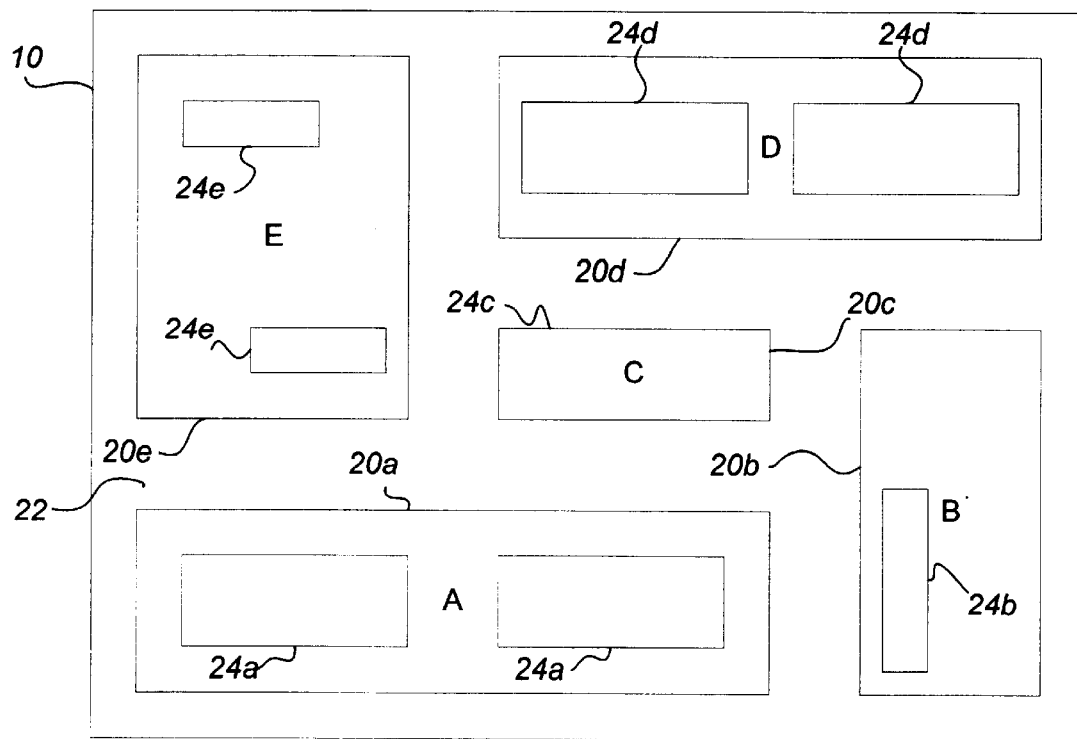
FIG. 4 is a top view of the layout of the IC of FIG. 1 illustrating the functional blocks overlaid by the reserved over-the-block metal M4 areas after the blocks have been designed in accordance with the guidelines.

The block designers determine actual block port locations and areas of any M4, M5, and M6 metal required for intra-block routing. The port locations and associated intra-block metal areas are reserved 110 for the blocks. FIG. 4 is a top view of the layout of IC 10 illustrating functional blocks 20a–20f overlaid by the reserved over-the-block metal M4 areas after the blocks have been designed in accordance with the guidelines established in step 102. As illustrated, functional block A 20a requires approximately 30% of the over-the-block M4 metal, shown at 24a. Functional block B 20b requires approximately 20% of the over-the-block M4 metal; functional block C 20c requires 100% of the over-the-block M4 metal; functional block D 20d requires approximately 40% of the over-the-block M4 metal; and functional block E 20e requires approximately 20% of the over-the-block M4 metal. The flexibility offered by allowing different percentage usage of metal for each block thereby allows the unused over-the-block metal in each block to be used for global inter-block routing.

Figure 7:
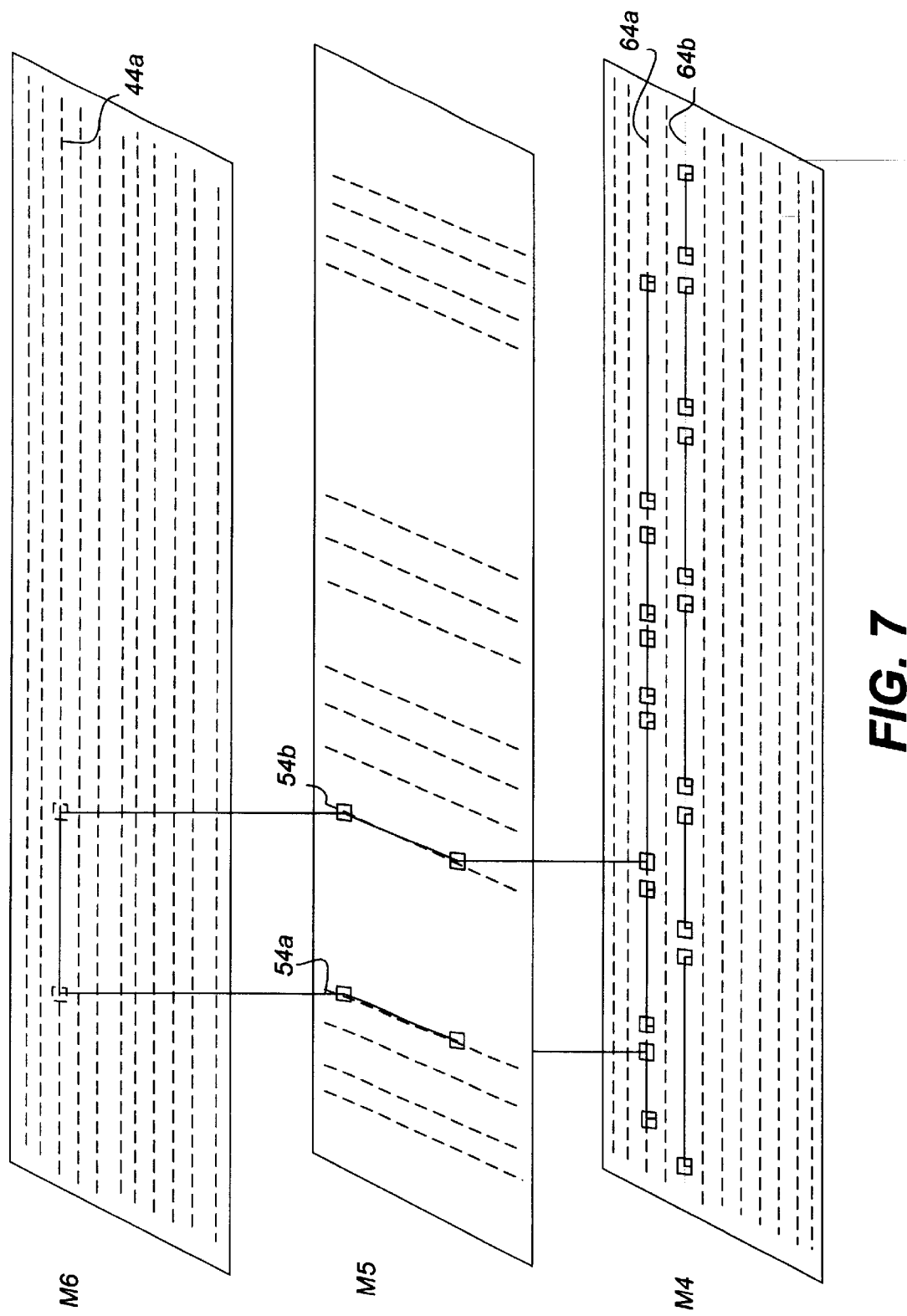
FIG. 7 is a breakout perspective view of a portion of the IC of FIG. 1 illustrating an example implementation of the intra-block routing metal usage of a functional block.

FIG. 7 is a perspective view of the same portion of IC 10 of FIGS. 5 and 6 illustrating the reserved tracks areas for over-the-block intra-block routing for the underlying functional block. In the illustrative example (FIG. 7), the intra-block routing in the upper layers is reserved on tracks 42a and 42b of M6. Intra-block signals are routed along tracks 42a, 42b, and connect respectively to M5 tracks 52a, 52b, which connect to M4 track 64a. Track 64b of layer M4 is also reserved for use by functional block 20a.

Once the block port locations and areas reserved for any M4, M5, and M6 metal required for intra-block routing is established, the global inter-block signals are then pre-routed 112 (FIG. 3) using metal in M4, M5 and M6 that is not reserved for the power grid, clock grid, or functional blocks. In the illustrative embodiment, pre-routing is performed manually using a floorplanning tool such as IC Master manufactured by Cadence Corp.

Figure 8:
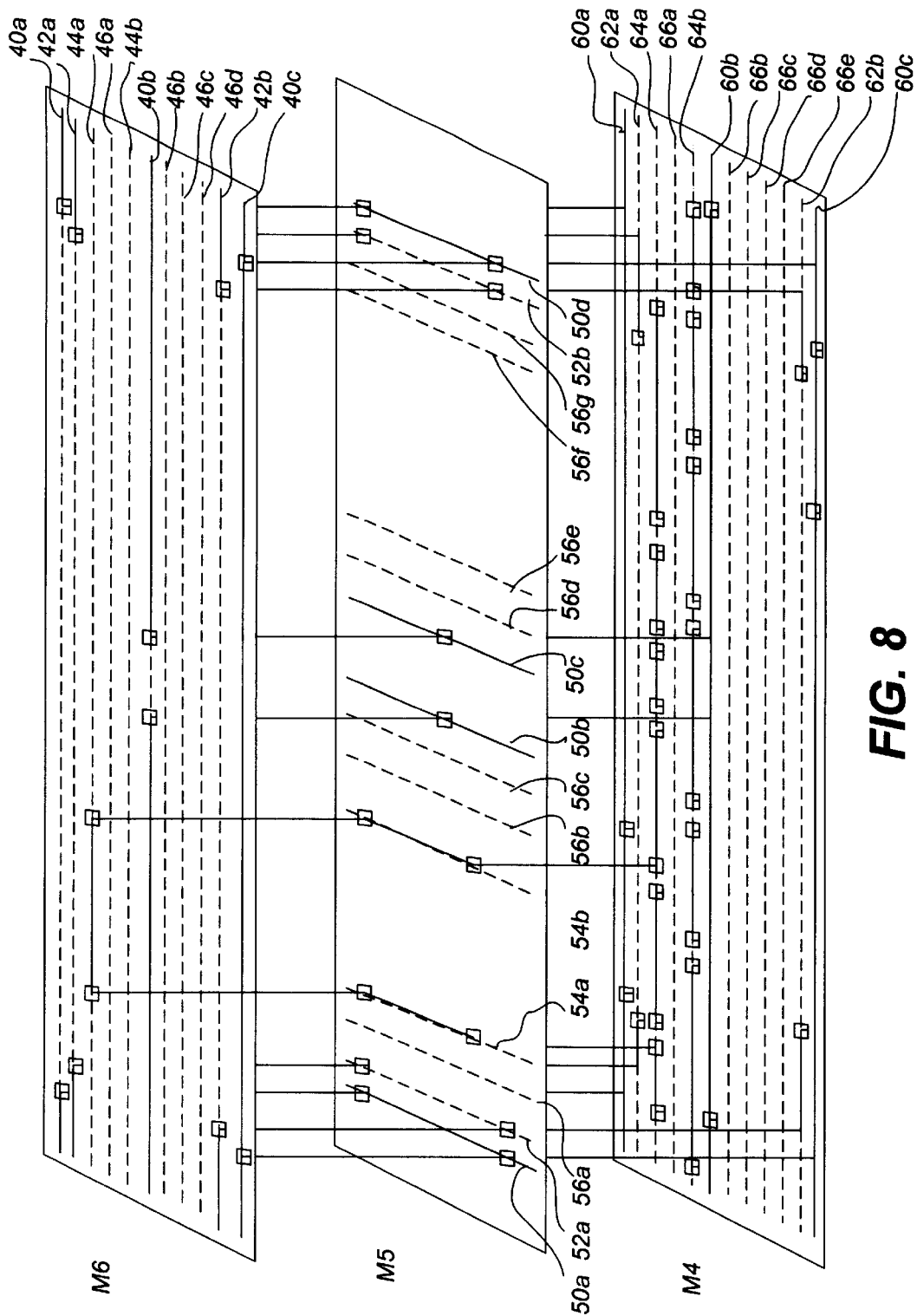
FIG. 8 is a breakout perspective view of a portion of the IC of FIG. 1 illustrating the example implementation of FIGS. 5, 6 and 7 and the remaining available metal available for use by global inter-block routing.

FIG. 8 is a perspective view of the same portion of IC 10 of FIGS. 5, and 7 illustrating the reserved metal for the power grid, clock grid, and over-the-block intra-block routing for the underlying functional block. The remaining unused track areas are available for use for global routing. In the illustrative example, all of tracks 46a–46d along with portions of tracks 42a–42b, 44a in M6, all of tracks 56a–56g along with portions of 52a–52b, 54a–54b in M5, and all of tracks 66a–66e along with portions of tracks 62a–62b, 64a in M4 are available for inter-block routing.

During the pre-route process, if any nets are encountered 114 that are problematic in terms of timing or inability to route (due to signal congestion in certain areas), the signal port locations and placement of sub-blocks within the blocks are altered 116, taking into account the existing pre-routes, to achieve better signal performance and/or a simpler routing solution. The pre-route step and port and/or sub-block relocation step often results in the identification of changes that can be made that an automated router tool might not be able to identify.

With the changed signal port locations and sub-block placement within the blocks, the process is repeated until no unroutable inter-block interconnects are encountered and all nets result in satisfactory performance.

It will be appreciated by the above detailed description that the present invention enables advantages in efficiency over the prior art. The communication between block designers as to the block routing requirements facilitates better placement of sub-blocks and signal ports. This results in more efficient use of over-the-block routing metal, as well as facilitates the ability to create higher density blocks. In addition, the allowance of multi-use tracks in over-the-block routing results in less unused metal and therefore also allows higher density blocks.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. A method for managing metal resources during over-the-block routing of an integrated circuit, said integrated circuit comprising a silicon layer partitioned into and implementing a plurality of functional blocks, and a plurality of metal layers layered over said silicon layer, said method comprising the steps of:

allocating a percent usage of over-the-block metal over each of said functional blocks in each of said metal layers for intra-block routing, said percent usage allocated for intra-block routing being different between at least two of said plurality of functional blocks;

reserving areas of said over-the-block metal on each of said metal layers for routing a power grid;

reserving areas of said over-the-block metal on each of said metal layers for routing a clock grid;

coordinating, among said plurality of functional blocks, locations of signal ports of said functional blocks so as to avoid blocking any inter-block signals;

reserving areas of said over-the-block metal on each of said metal layers for said signal ports and for routing intra-block signals;

prerouting said inter-block signals, allowing inter-block routing in said over-the-block metal on each of said metal layers but avoiding said reserved areas for said power grid, said clock grid, said signal ports and said intra-block signals.

2. The method of claim 1, further comprising:

determining better port locations and internal sub-block placement based on results of said pre-routing step if said pre-routing step results in an unroutable net or a net with unsatisfactory timing.

3. An integrated circuit, comprising:

a silicon layer implementing a plurality of functional blocks;

a plurality of metal layers layered over said silicon layer, each layer comprising a plurality of metal tracks, wherein:

portions of a first set of said plurality of tracks are allocated to and comprise over-the-block intra-block routes;

portions of said first set of said plurality of tracks are allocated to and comprise over-the-block inter-block routes;

said portions of said first set of said plurality of tracks allocated to said over-the-block intra-block routes being different between at least two of said plurality of functional blocks.

4. An integrated circuit in accordance with claim 3, further comprising:

a second set of said plurality of tracks comprising a power grid.

5. An integrated circuit in accordance with claim 3, further comprising:

a third set of said plurality of tracks comprising a clock grid.

6. An integrated circuit in accordance with claim 5, wherein:

portions of said third set of said plurality of tracks comprise over-the-block intra-block routes.

7. An integrated circuit in accordance with claim 6, wherein:

portions of said third set of said plurality of tracks comprise over-the-block inter-block routes.

8. An integrated circuit in accordance with claim 5, wherein:

portions of said third set of said plurality of tracks comprise over-the-block inter-block routes.

* * * * *